(12) United States Patent
Hsieh et al.

(10) Patent No.: US 11,189,442 B2
(45) Date of Patent: Nov. 30, 2021

(54) KEYSWITCH STRUCTURE

(71) Applicant: DARFON ELECTRONICS CORP., Taoyuan (TW)

(72) Inventors: Ming-Yuan Hsieh, Taoyuan (TW); Ling-Hsi Chao, Taoyuan (TW); Liang-Ta Yeh, Taoyuan (TW)

(73) Assignee: DARFON ELECTRONICS CORP., Taoyuan (TW)

( * ) Notice: Subject to any disclaimer, the term of this patent is extended or adjusted under 35 U.S.C. 154(b) by 393 days.

(21) Appl. No.: 16/512,415

(22) Filed: Jul. 16, 2019

(65) Prior Publication Data

US 2020/0381195 A1 Dec. 3, 2020

(30) Foreign Application Priority Data

Jun. 3, 2019 (TW) ................................. 108119137

(51) Int. Cl.
| | |
|---|---|
| *H01H 13/14* | (2006.01) |
| *H01H 1/54* | (2006.01) |
| *H01H 13/20* | (2006.01) |
| *H01H 3/12* | (2006.01) |

(52) U.S. Cl.
CPC ............. *H01H 13/14* (2013.01); *H01H 1/54* (2013.01); *H01H 3/12* (2013.01); *H01H 13/20* (2013.01); *H01H 2215/00* (2013.01); *H01H 2221/04* (2013.01)

(58) Field of Classification Search
CPC ........... H01H 13/14; H01H 1/54; H01H 3/12; H01H 3/122; H01H 3/125; H01H 13/20

USPC ................ 200/5 A, 5 R, 341, 344, 345, 520; 335/205

See application file for complete search history.

(56) References Cited

U.S. PATENT DOCUMENTS

| 9,748,058 B2 * | 8/2017 | Chen ...................... H01H 13/84 |
| 2015/0101917 A1 * | 4/2015 | Yen ........................ G06F 3/0221 |
| | | 200/5 A |

FOREIGN PATENT DOCUMENTS

| TW | 201515040 A | 4/2015 |
| TW | 201612934 A | 4/2016 |
| TW | 201724147 A | 7/2017 |
| TW | 201916078 A | 4/2019 |
| TW | 201919080 A | 5/2019 |

* cited by examiner

*Primary Examiner* — Edwin A. Leon
*Assistant Examiner* — Iman Malakooti
(74) *Attorney, Agent, or Firm* — Winston Hsu

(57) ABSTRACT

A keyswitch structure includes a base plate, a keycap, a lift mechanism connecting the keycap and the base plate, a movable part movably disposed relative to the base plate, a linking support, and a magnetic part on the base plate. The linking support has a pivotal connection portion, a magnetic portion, and a driving portion. The magnetic part and the magnetic portion produce a magnetic attraction force therebetween. When the movable part is located at a first position, the pivotal connection portion is rotatably disposed on a protruding portion of the movable part, and the magnetic attraction force drives the keycap through the linking support to move away relative to the keycap. When the movable part moves from the first position to a second position, the protruding portion moves away, so that the pivotal connection portion falls down and the keycap moves toward the base plate.

18 Claims, 19 Drawing Sheets

KEYSWITCH STRUCTURE

BACKGROUND OF THE INVENTION

1. Field of the Invention

The present invention relates to a magnetic keyswitch, and more particularly to a magnetic keyswitch of which the keycap can be moved downward for storage.

2. Description of the Prior Art

The keyboards of conventional notebook computers are not designed to have keycaps that can be moved downward for storage. No matter whether the display screen is open or closed, the keycaps are located at the same height (i.e. the position when unpressed). Thereby, the height of the conventional keyboard is fixed. When a user has no need to use the notebook computer, the user will close the display screen. Because the keycaps of the conventional notebook computer does not move downward for storage, the display screen may impact the keycaps and therefore get damaged. Furthermore, the keyboard occupies relatively more space, which limits the thinner development of the notebook computer. Furthermore, if the keyswitch of the keyboard is designed to use an elastic member (e.g. a rubber dome) for providing a restoration force to the keycap, when the keycap is forced to move downward for storage, the elastic member, in principle, will be at a state of being pressed for a long time, which may induce a permanent deformation affecting the elasticity of the elastic member and harmful to the lifespan of the elastic member.

SUMMARY OF THE INVENTION

The present disclosure provides a keyswitch structure, which uses a magnetic attraction force as a restoration force and makes a keycap of the keyswitch structure move downward for storage by moving away a protruding portion used for supporting a support producing the magnetic attraction force.

A keyswitch structure according to the present invention includes a base plate, a keycap, a lift mechanism, a movable part, a linking support, and a magnetic part. The keycap is disposed above the base plate. The lift mechanism is connected to and between the base plate and the keycap. The keycap can move relative to the base plate substantially along a vertical direction through the lift mechanism. The movable part is movably disposed relative to the base plate substantially along a horizontal direction. The movable part includes a movable plate and a protruding portion. The protruding portion protrudes upward from a surface of the movable plate. The linking support has a pivotal connection portion, a magnetic portion, and a driving portion. The magnetic portion and the driving portion are located at two sides of the pivotal connection portion. The linking support is rotatably disposed on the protruding portion through the pivotal connection portion. The driving portion abuts against one of the lift mechanism and the keycap. The magnetic part is disposed on the base plate. The magnetic portion and the magnetic part produce a magnetic attraction force therebetween. Therein, when the movable part is located at a first position, the magnetic part is located under the magnetic portion, and the magnetic attraction force drives the keycap through the linking support to move away relative to the base plate. When the movable part substantially horizontally moves from the first position to a second position, the magnetic part moves away from a position under the pivotal connection portion, so that the pivotal connection portion departs from the protruding portion and moves downward so as to make the keycap move toward the base plate.

Compared with the prior art, in the keyswitch structure according to the present invention, the keycap can move downward for storage even though the keycap does not receive external pressing force thereon. Furthermore, the restoration force (i.e. the magnetic attraction force) to the keycap is not produced by an elastic structure, so the keyswitch structure will not have the problem in the prior art that the elastic member may involve a permanent deformation affecting the elasticity of the elastic member.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
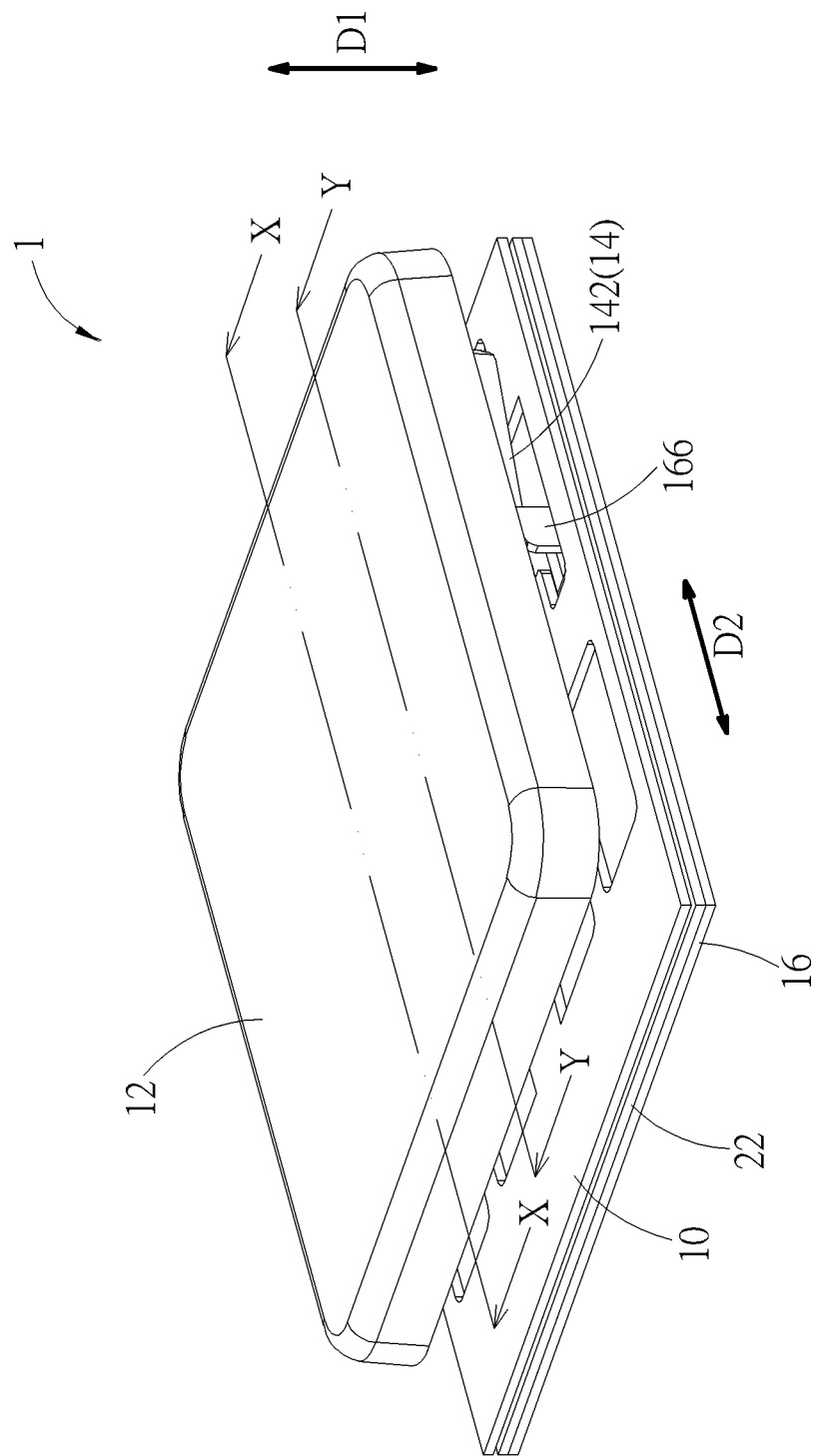
FIG. 1 is a schematic diagram illustrating a keyswitch structure of an embodiment according to the invention.

Please refer to FIG. 1 to FIG. 10. A keyswitch structure 1 according to an embodiment includes a base plate 10, a keycap 12, a lift mechanism 14, a movable part 16, a linking support 18, a magnetic part 20, and a switch circuit board 22. The keycap 12 is disposed above the base plate 10. The lift mechanism 14 is connected to and between the base plate 10 and the keycap 12, so that the keycap 12 can move relative to base plate 10 substantially along a vertical direction D1 (indicated by a double-head arrow in FIG. 1 and FIG. 8 to FIG. 10) through the lift mechanism 14. The movable part 16 is movably disposed relative to the base plate 10 substantially along a horizontal direction D2 (indicated by a double-head arrow in FIG. 1 and FIG. 8 to FIG. 10). The movable part 16 includes a movable plate 162 and a protruding portion 164. The protruding portion 164 protrudes upward from a surface 162*a* of the movable plate 162 (or protrudes toward the keycap 12). The movable part 16 is operable to horizontally move relative to the base plate 10 to change the horizontal position of the protruding portion 164 relative to the base plate 10. In FIG. 1, FIG. 2, FIG. 8 and FIG. 10, the movable part 16 is located at a first position, and the keyswitch structure 1 is at a status of being capable of being pressed by user. The linking support 18 has a pivotal connection portion 182, a magnetic portion 184, and a driving portion 186. The magnetic portion 184 and the driving portion 186 are located at opposite sides of the pivotal connection portion 182. When the movable part 16 is located at the first position, the linking support 18 is rotatably disposed on the protruding portion 164 through the pivotal connection portion 182. The driving portion 186 abuts against the lift mechanism 14. The magnetic part 20 is disposed on the base plate 10. The magnetic part 20 is located under the magnetic portion 184. The magnetic portion 184 and the magnetic part 20 produce a magnetic attraction force F (indicated by a double-head arrow in FIG. 8 and FIG. 10) therebetween. The magnetic attraction force F makes the magnetic portion 184 of the linking support 18 lower, so as to make the linking support 18 rotate around the pivotal connection portion 182 to drive the driving portion 186 to move upward, so that the keycap 12 is lifted to move away relative to the base plate 10. The switch circuit board 22 has a switch 222 (shown by a hatched circle in FIG. 4 and by a rectangle in FIG. 8 and FIG. 10) and is disposed on the movable part 16 to be movable together with the movable part 16. The keycap 12 can be pressed to move down, so as to trigger the switch 222. When the keycap 12 is not pressed any more, the magnetic attraction force F serves as a restoration force to make the keycap 12 move upward to return its original higher position.

In the embodiment, the lift mechanism 14 is realized by a scissors support and includes a first support 142 and a second support 144. The first support 142 and the second support 144 are pivotally connected relative to a rotation axis 14*a* (indicated by a chain line in FIG. 2 and FIG. 3). The rotation axis 14*a* is perpendicular to the vertical direction D1 and the horizontal direction D2. The first support 142 is connected to a first keycap connection portion 122 of the keycap 12 (realized by two sliding slots which protrude downward from a bottom surface 120*a* of a cap body 120 of the keycap 12) through a first upper end portion 1422 and is connected to a first base plate connection portion 102 of the base plate 10 (realized by two L-shaped hooks) through a first lower end portion 1424. The second support 144 is connected to a second keycap connection portion 124 of the keycap 12 (realized two droplet-shaped holes which protrude downward from the bottom surface 120*a* of the cap body 120) through a second upper end portion 1442 and is connected to a second base plate connection portion 104 of the base plate 10 (realized by two L-shaped hooks) through a second lower end portion 1444. Thereby, the keycap 12 can vertically move relative to the base plate 10 through the first support 142 and the second support 144.

Figure 8:
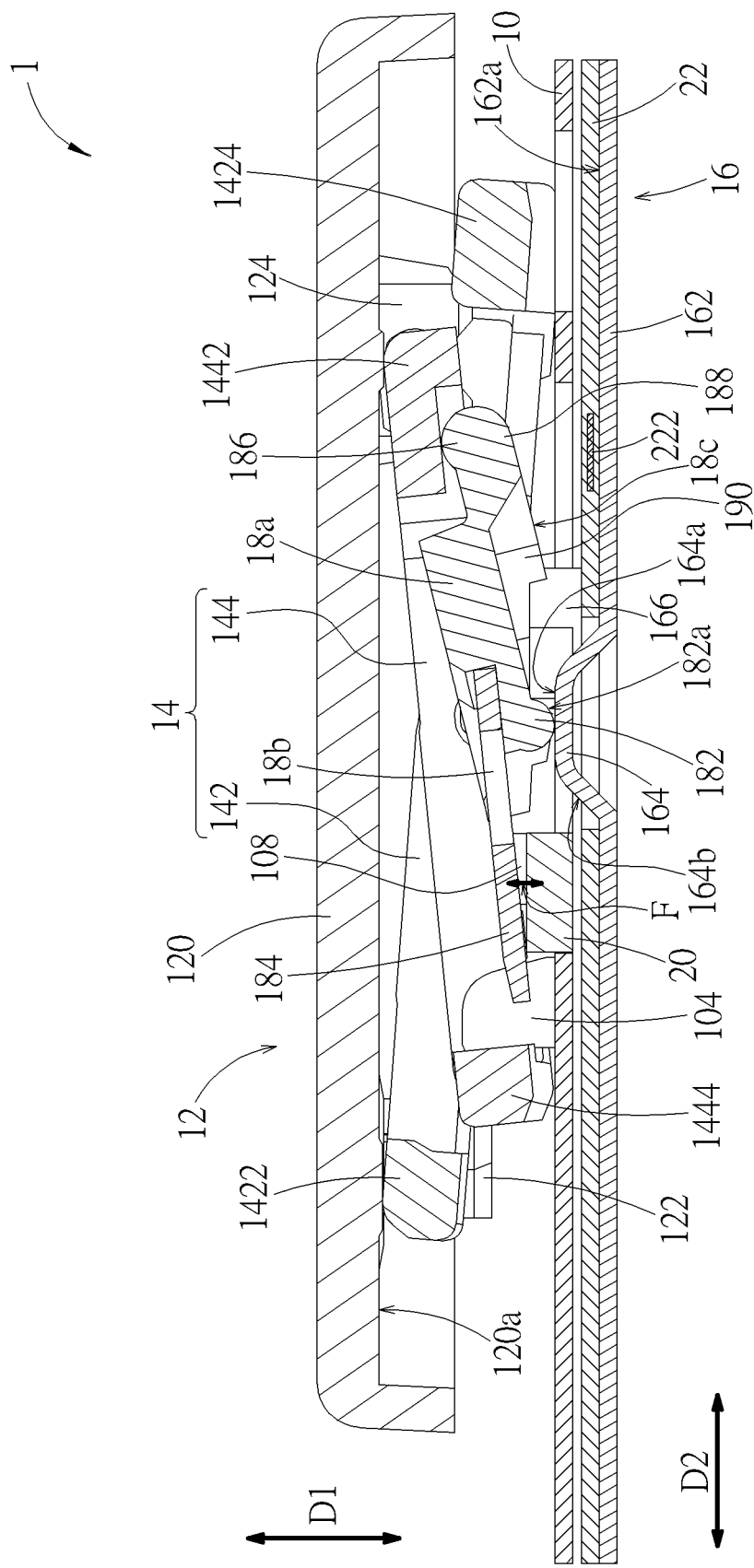
FIG. 8 is a sectional view of the keyswitch structure along the line X-X in FIG. 1.
Figure 9:
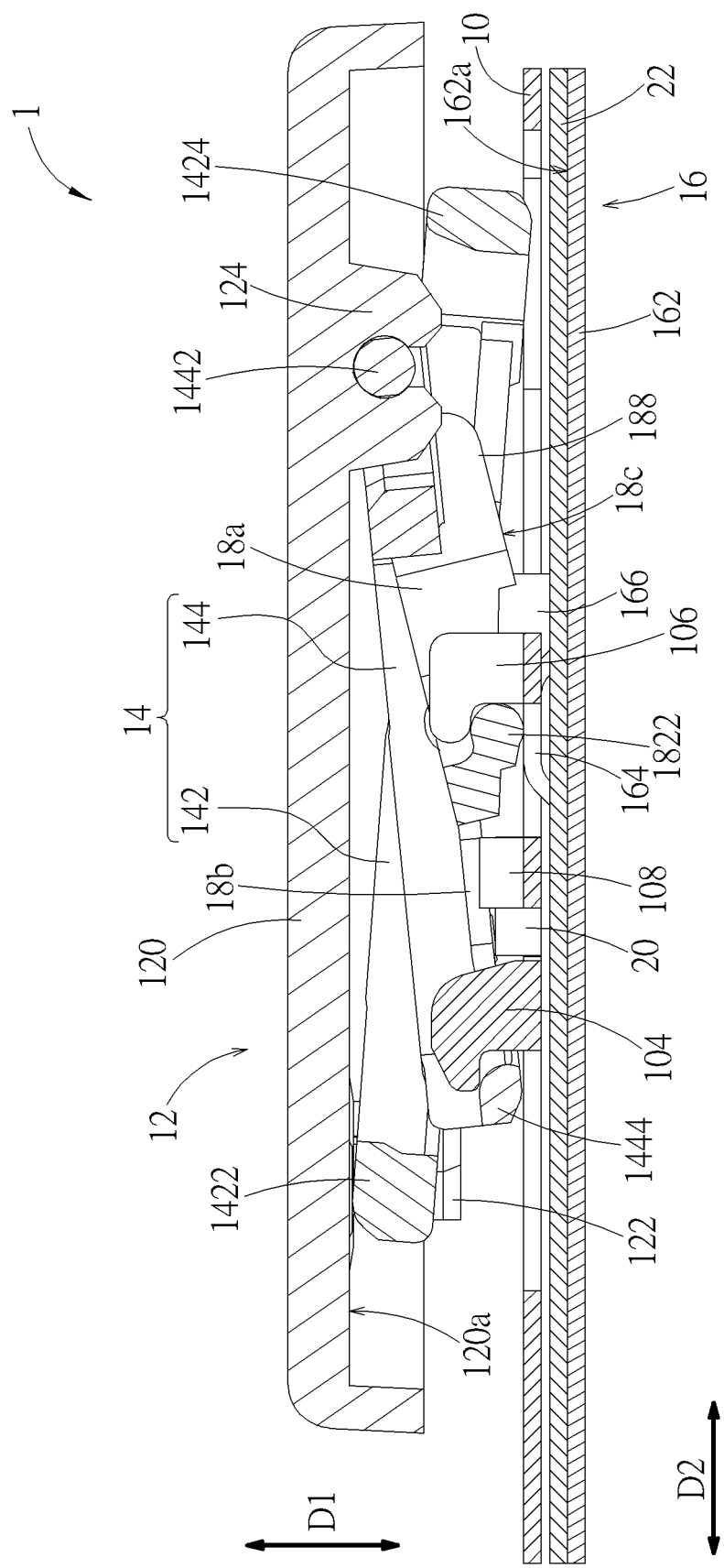
FIG. 9 is a sectional view of the keyswitch structure along the line Y-Y in FIG. 1, of which the cutting plane passes through a limitation structure of a base plate of the keyswitch structure.
Figure 10:
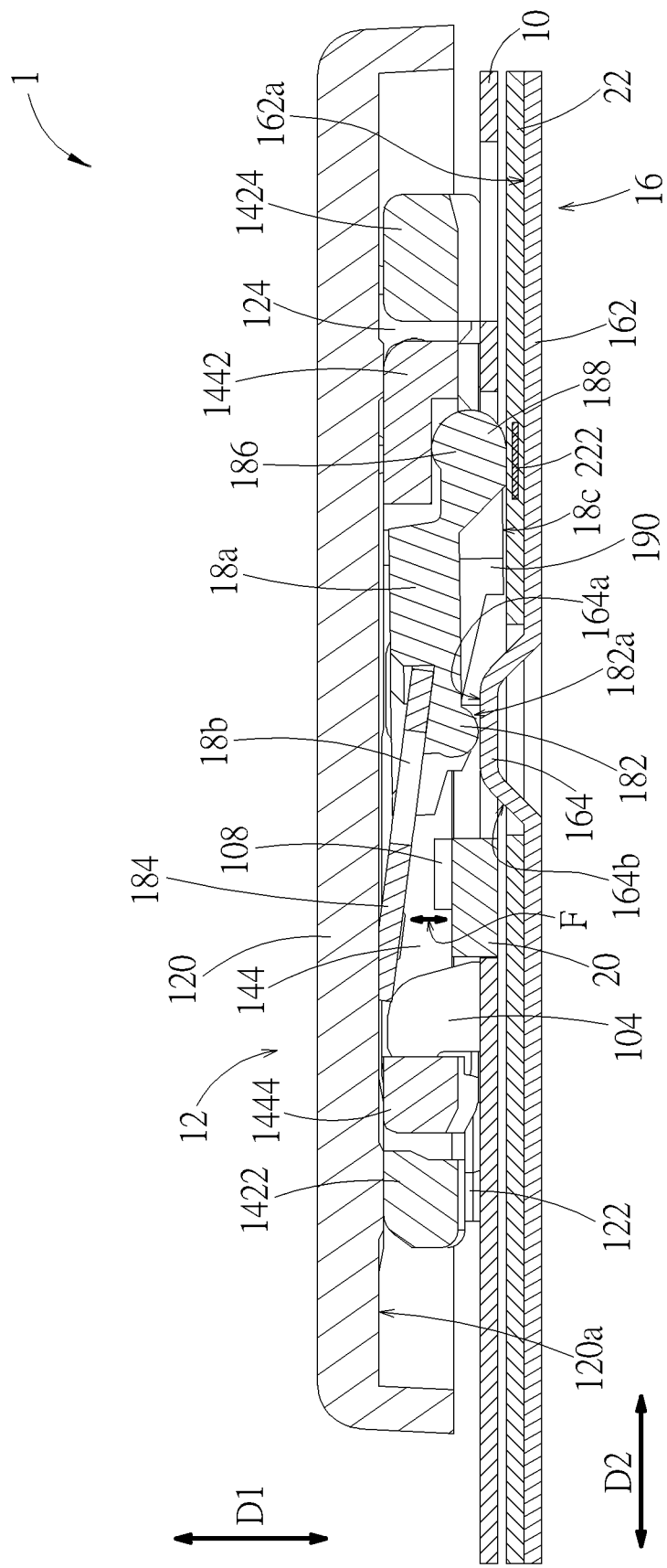
FIG. 10 is a sectional view of the keyswitch structure in FIG. 8 when the keycap is pressed.

The linking support 18 includes a plastic part 18*a* and a paramagnetic plate 18*b*. The paramagnetic plate 18*b* fits in the plastic part 18*a*. In practice, it is practicable to join the paramagnetic plate 18*b* into the plastic part 18*a* by insert moulding, so that the plastic part 18*a* can be provided with less opening so as to enhance the structural strength of the plastic part 18*a*. The plastic part 18*a* forms the driving portion 186 and the pivotal connection portion 182. The paramagnetic plate 18*b* forms the magnetic portion 184. Furthermore, the plastic part 18*a* also forms a triggering portion 188 toward the base plate 10. As shown by FIG. 10, the magnetic portion 184 and the triggering portion 188 are located at two sides of the pivotal connection portion 182. The switch 222 is located under the linking support 18 (or the triggering portion 188 thereof). When the keycap 12 is pressed, the triggering portion 188 triggers the switch 222. The movable plate 162 of the movable part 16 is movably disposed under the base plate 10. The base plate 10 has an opening corresponding to the protruding portion 164 so as to expose the protruding portion 164, so that the pivotal connection portion 182 can abut against the protruding portion 164. The protruding portion 164 can support the linking support 18 through the pivotal connection portion 182, so that the linking support 18 can take the pivotal connection portion 182 as a fulcrum so as to rotate relative to the protruding portion 164. In the embodiment, the driving portion 186 abuts upward against a portion of the second support 144 close to the second upper end portion 1442. Furthermore, two end portions 1822 of the pivotal connection portion 182 fit in a limitation structure 106 of the base plate 10 (realized by two L-shaped hooks which are engaged with the end portions 1822 respectively), as shown by FIG. 9. That is, as shown by FIG. 8 to FIG. 10, the protruding portion 164 and the limitation structure 106 commonly constrain the pivotal connection portion 182, which is conducive to the stability of the rotation of the linking support 18 relative to the protruding portion 164. Therein, in the view point of FIG. 8 to FIG. 10, the protruding portion 164 limits the downward movement of the pivotal connection portion 182. The limitation structure 106 limits the upward and rightward movement of the pivotal connection portion 182 (or the end portion 182 thereof).

The switch circuit board 22 is disposed on the movable plate 162 under the base plate 10. The base plate 10 has an opening corresponding to the switch 222 so as to expose the switch 222; thereby, the linking support 18 (or the triggering portion 188 thereof) above the base plate 10 can rotate relative to the protruding portion 164 to trigger the switch 222. In practice, the switch circuit board 22 can be realized by but not limited to a conventional three-layered membrane circuit board of (of which the upper and lower layers carry circuitry, and of which the middle layer insulates the circuitry on the upper and lower layers). For simplification of drawings, the switch circuit board 22 is still shown by a single part. For example, the switch circuit board 22 can be realized by a printed circuit board or a flexible printed circuit, on which a tact switch (serving as a mechanical switch 222) or a combination a light source and an optical sensor (serving as an optical switch 222) is soldered. The magnetic part 20 is a magnet and is fixed on the base plate 10 through a constraint structure 108 of the base plate 10 (realized by two opposite structures extending upward and bending).

In addition, in practice, for example, the base plate 10 can be realized by but not limited to a metal stamping part, in which the first base plate connection portion 102, the second base plate connection portion 104, and the limitation structure 106 are formed by bending L-shaped plates upward and the constraint structure 108 is formed by bending plate portions upward to be L-shaped. Each of the keycap 12, the first support 142, and the second support 144 can be realized by an injection plastic part. The movable part 16 can be realized by a metal stamping part, of which the protruding portion 164 is formed by extruding a portion of the metal stamping part upward to a form of trapezoid. In addition, in practice, the linking support 18 as a whole also can be realized by a paramagnetic metal stamping part. In another case, when the magnetic portion 184 is realized by a magnet, the magnetic part 20 can be realized by a part made of a paramagnetic material.

Figure 7:
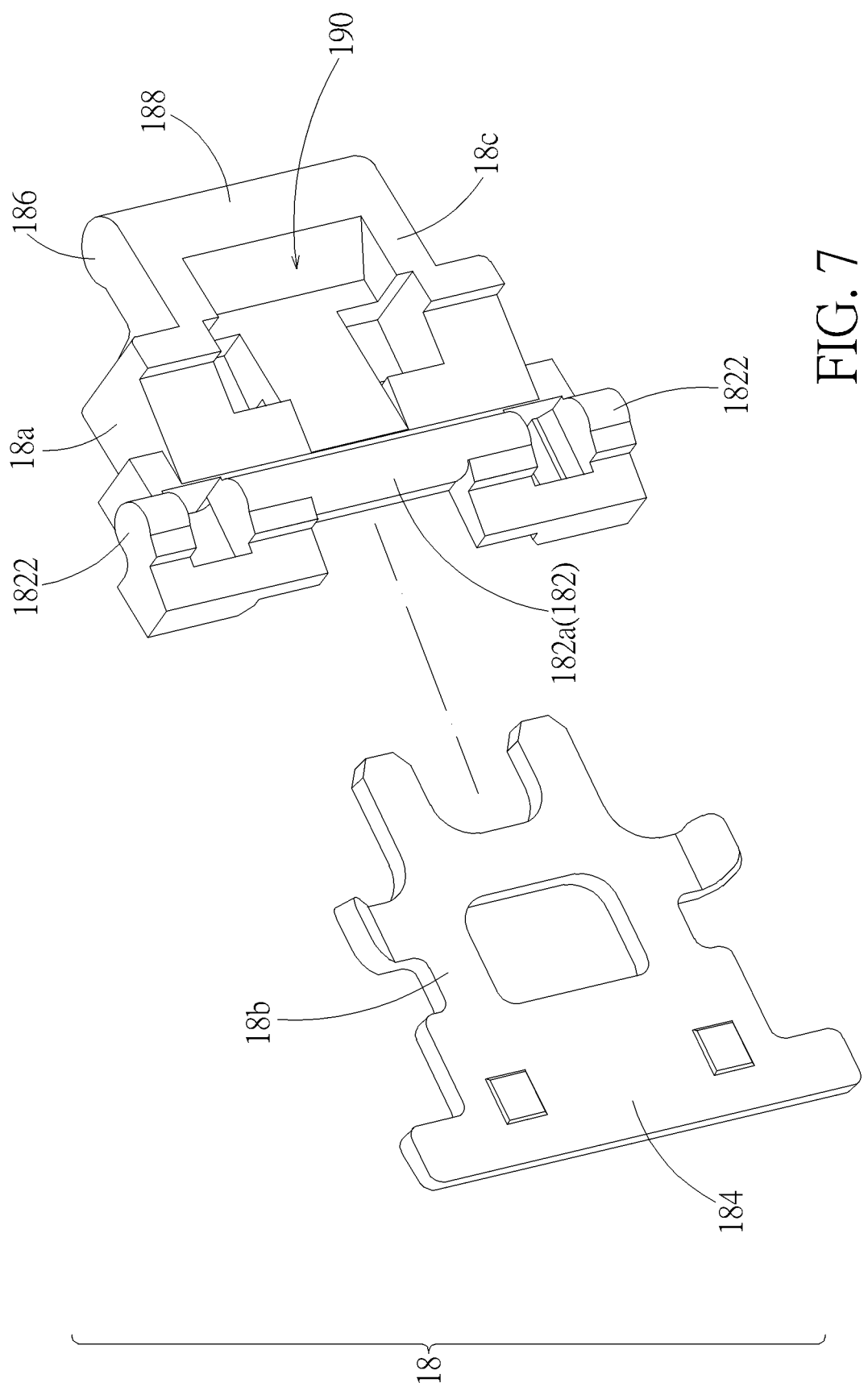
FIG. 7 is a schematic diagram illustrating FIG. 6 in another view.
Figure 11:
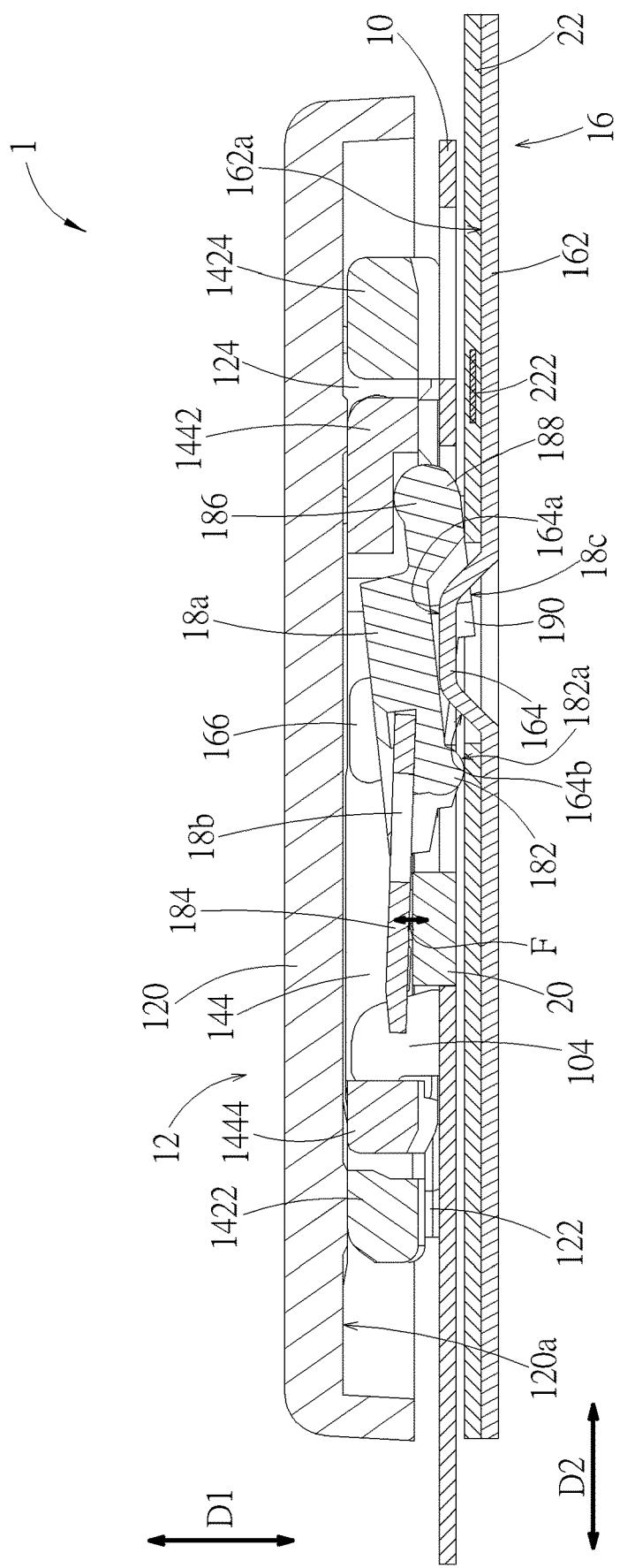
FIG. 11 is a sectional view of the keyswitch structure in FIG. 8 at a storage status.

Please refer to FIG. 7, FIG. 8, and FIG. 11. When the movable part 16 substantially horizontally moves (or moves rightward) from the first position (as shown by FIG. 8) to a second position (as shown by FIG. 11), the protruding portion 164 also horizontally moves together with the movable part 16 away from the position under the pivotal connection portion 182, so that the pivotal connection portion 182 departs from the protruding portion 186 and moves downward so as to make the keycap 12 move toward the base plate 10, for convenience of storage. As the pivotal connection portion 182 departs from the protruding portion 186 and moves downward, the pivotal connection portion 182 departs from the limitation structure 106. At this moment, the keyswitch structure 1 is at a storage status. Furthermore, the linking support 18 (or the plastic part 18a) has a relief recess 190, formed a bottom surface 18c thereof. When the movable part 16 is located at the second position, the protruding portion 164 enters the relief recess 190 so as to reduce a height of the pivotal connection portion 182 and the protruding portion 164 when collapsed, and also reduce a height of the whole keyswitch structure 1 (at the storage status). Furthermore, the switch circuit board 22 moves together with the movable part 16, so that when the movable part 16 is located at the second position, the switch 222 is away from a projection area where the linking support 18 is projected downward along the vertical direction D1. Therefore, when the keyswitch structure 1 is at the storage status, the triggering portion 188 will not compress the switch 222, which can avoid applying force to the switch 222 for a long time so as to effectively prolong the lifespan of the switch 222. In addition, after the protruding portion 164 moves away from the position under the pivotal connection portion 182, the weight of the lift mechanism 14, the keycap 12, and the linking support 18 is also conducive to the collapse of the keyswitch structure 1. Furthermore, during the movement of the movable part 16 from the first position to the second position, the magnetic attraction force F also helps the linking support 18 to rotate toward the base plate 10, which is conducive to a collapse of the linking support 18 toward the base plate 10.

In the embodiment, the protruding portion 164 has a top surface 164a and a guiding slant surface 164b. The guiding slant surface 164b is adjacent to the top surface 164a. The pivotal connection portion 182 has a curved surface 182a. When the keyswitch structure 1 is at the status of being capable of being pressed by user, the pivotal connection portion 182 is supported on the top surface 164a. When the keyswitch structure 1 at the storage status (as shown by FIG. 11) is required to be changed to the status of being capable of being pressed by user, the movable part 16 can be operated to move reversely (or move leftward, i.e. substantially horizontally moving from the second position to the first position) so as to make the guiding slant surface 164b guide the curved surface 182a to slide upward from the surface 162a of the movable plate 162 back to the top surface 164a, so that the keyswitch structure 1 is at the status of being capable of being pressed by user (as shown by FIG. 8). In practice, the guiding slant surface 164b has the effect of guiding the pivotal connection portion 182 to slide over the protruding portion 164, so the pivotal connection portion 182 can be a structure with a V-shaped sectional profile so that the pivotal connection portion 182 can abut against the protruding portion 164 through a structural edge thereof.

Figure 12:
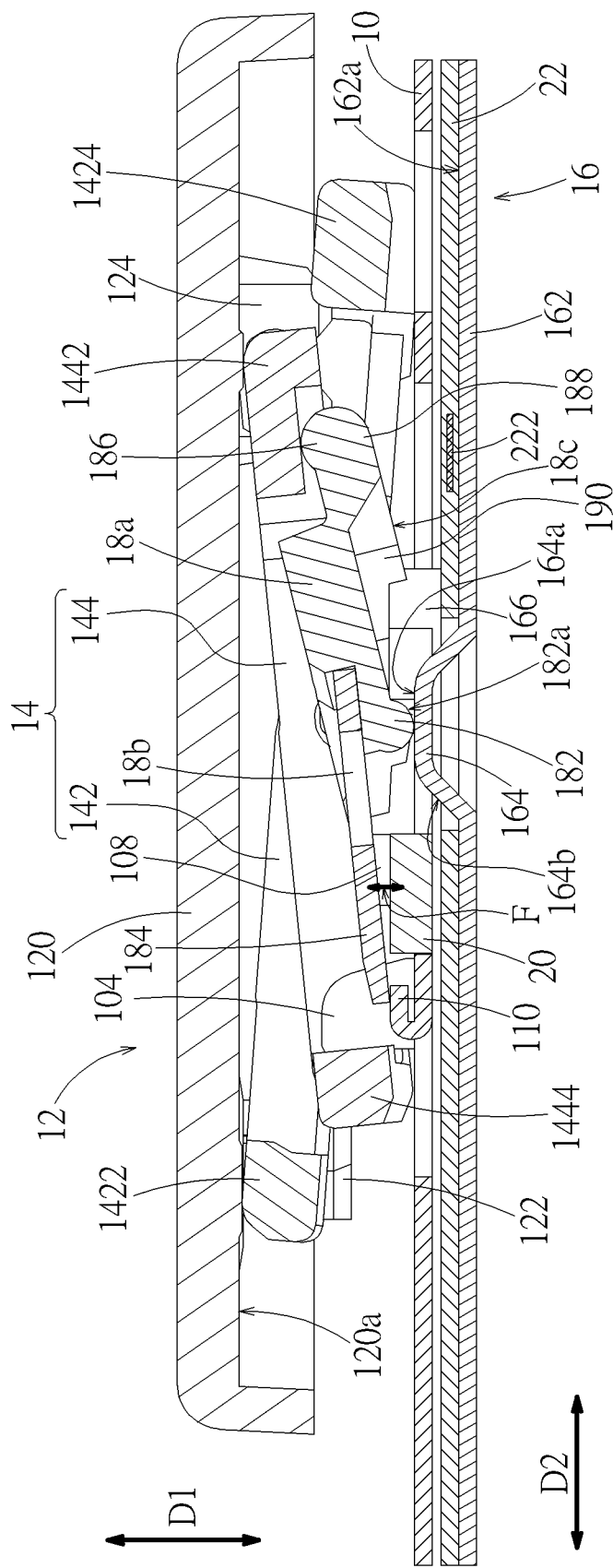
FIG. 12 is a sectional view of the keyswitch structure in FIG. 8 according to another embodiment.

In addition, in the embodiment, when the movable part 16 is located at the first position and the keycap 12 is not pressed yet (as shown by FIG. 8), the magnetic portion 184 line-contacts the magnetic part 20, which facilitates the movement of the movable part 16. In practice, it is practicable to dispose the magnetic portion 184 and the magnetic part 20 to be separate from each other (i.e. when the keyswitch structure 1 is at the status of being capable of being pressed by user, the magnetic portion 184 does not touch the magnetic part 20), as shown by FIG. 12. Therein, the base plate 10 includes a stop structure 110 for blocking the magnetic portion 184 from touching the magnetic part 20. This configuration makes the movement of the movable part 16 easier.

Figure 2:
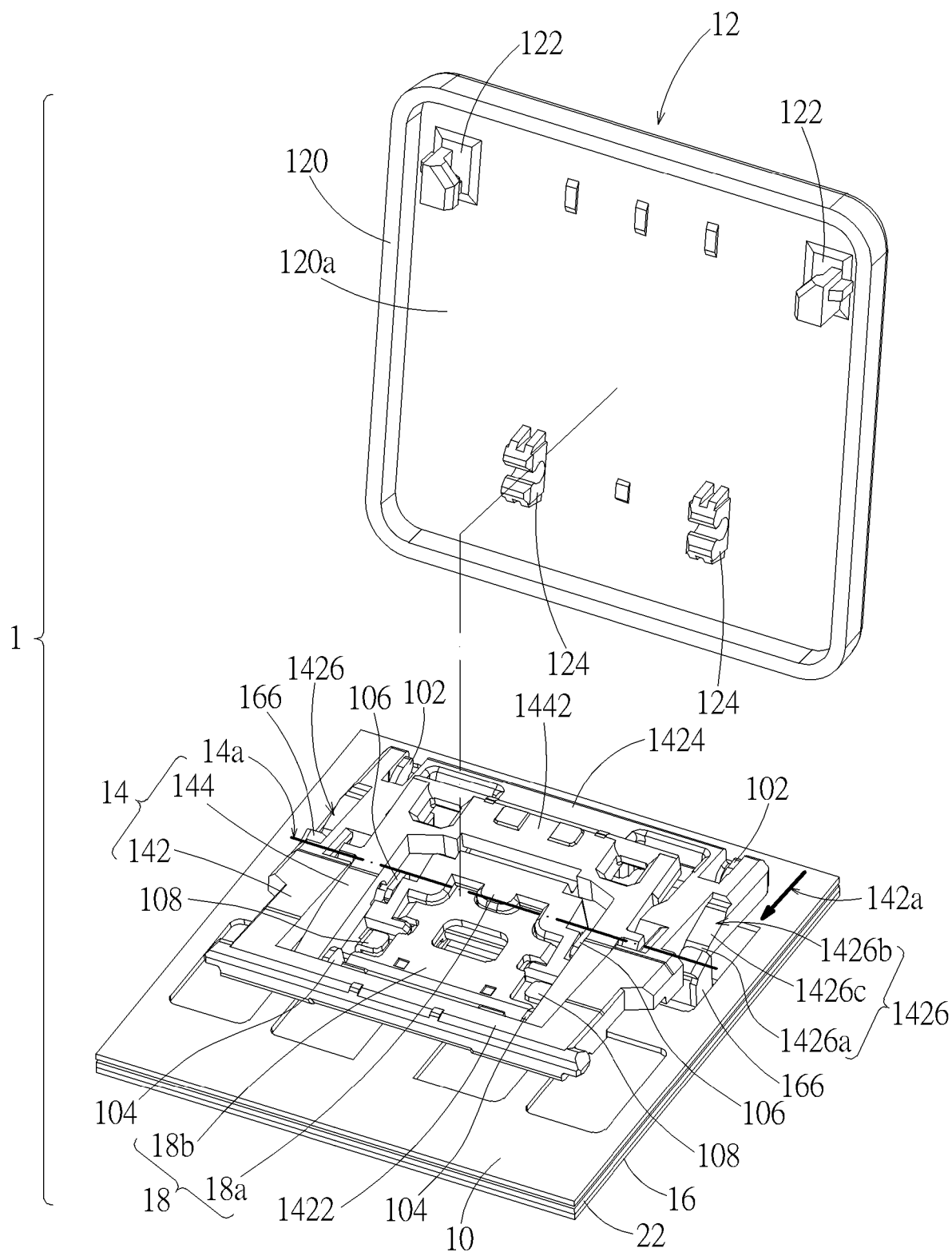
FIG. 2 is a partially-exploded view of the keyswitch structure in FIG. 1.
Figure 3:
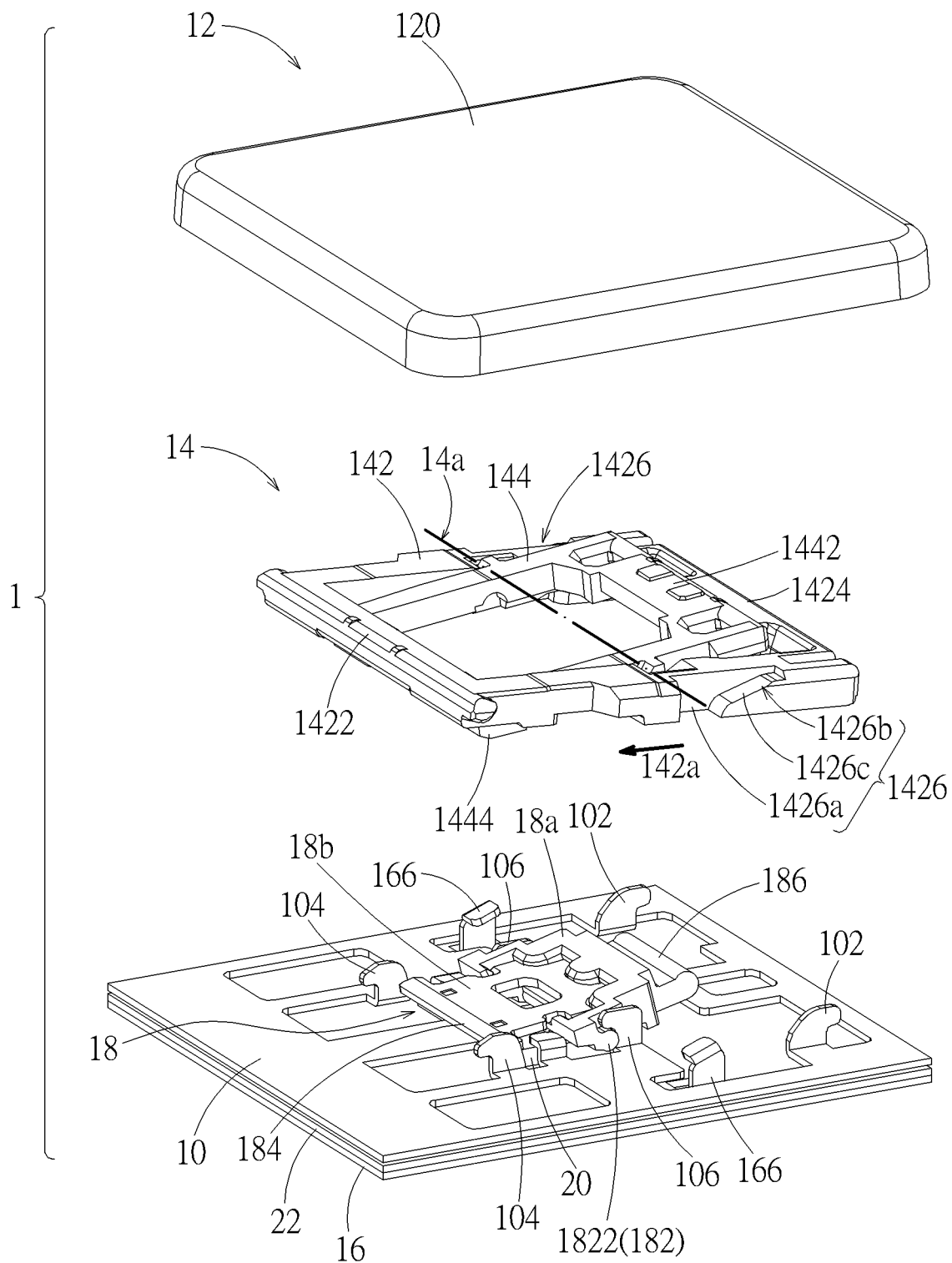
FIG. 3 is another partially-exploded view of the keyswitch structure in FIG. 1.
Figure 4:
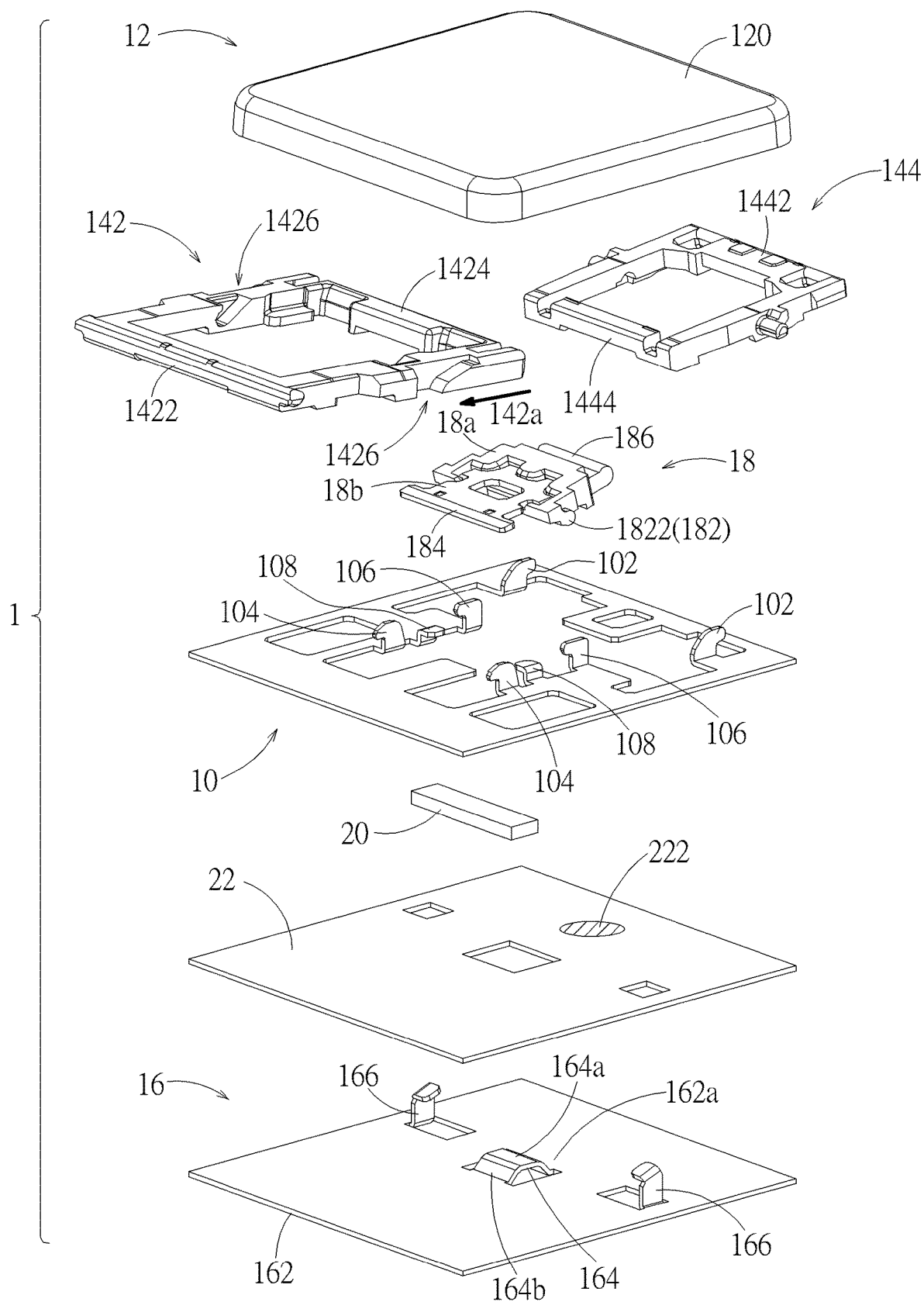
FIG. 4 is an exploded view of the keyswitch structure in FIG. 1.
Figure 5:
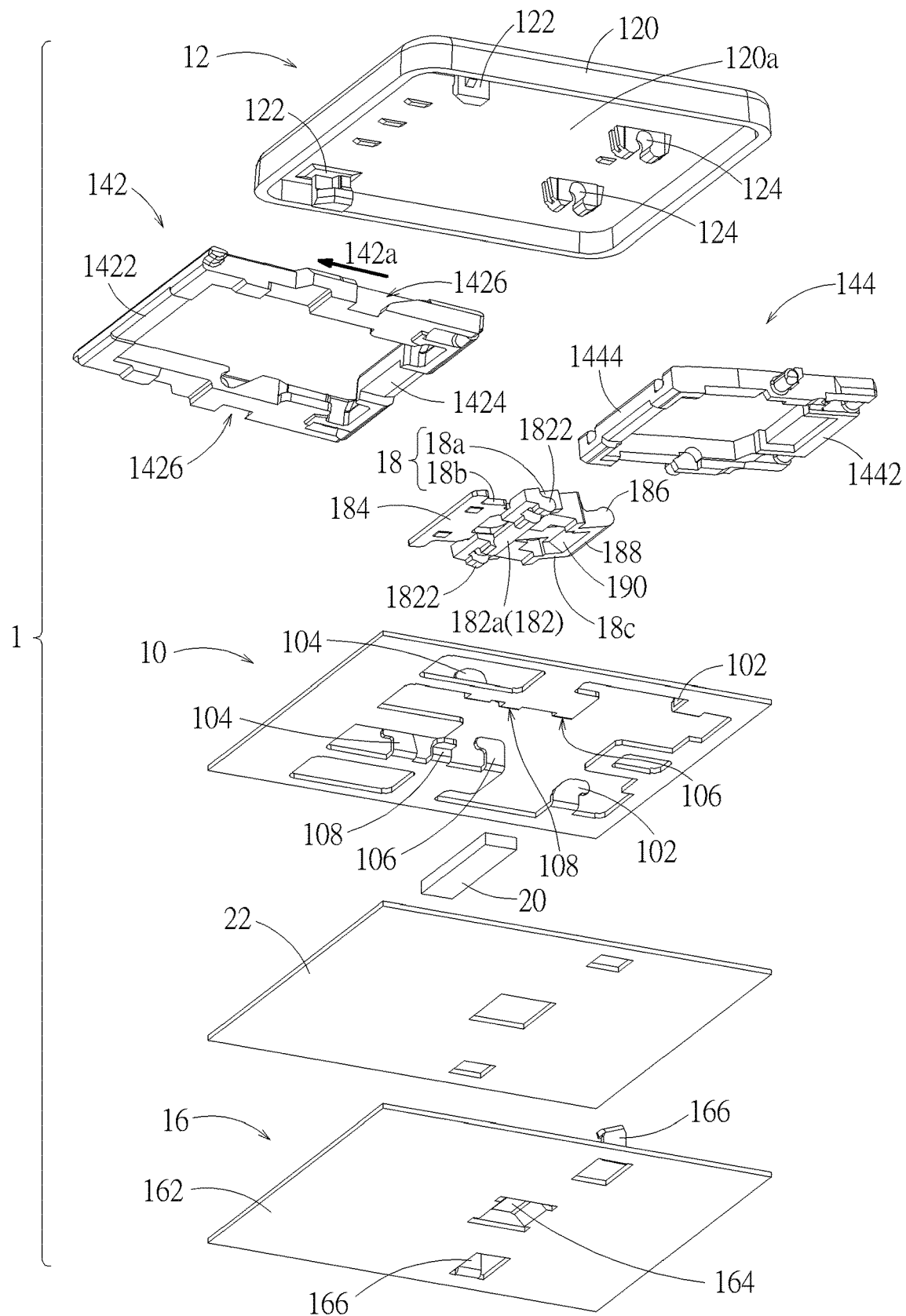
FIG. 5 is a schematic diagram illustrating FIG. 4 in another view.
Figure 6:
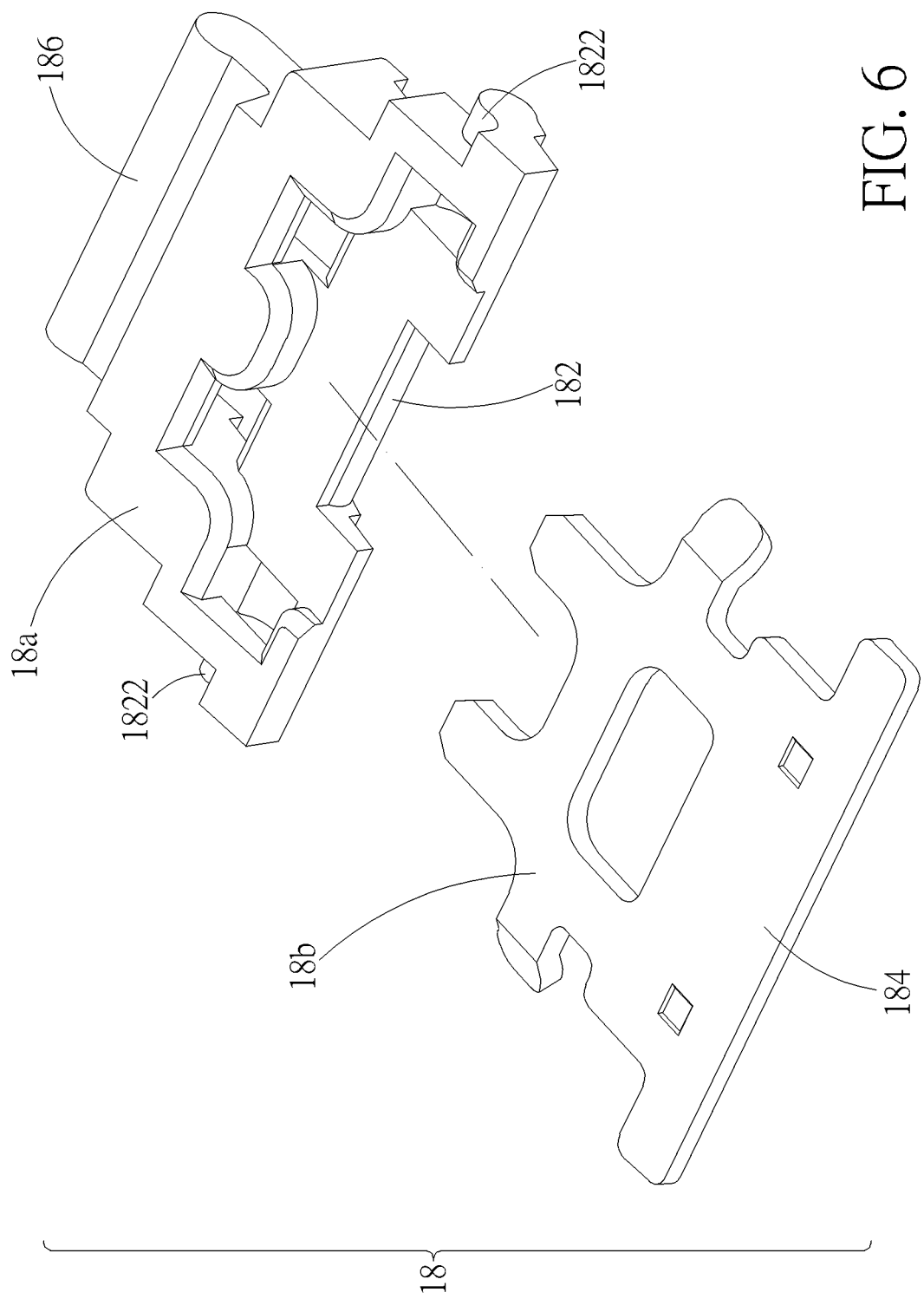
FIG. 6 is an exploded view of a linking support of the keyswitch structure in FIG. 3.
Figure 13:
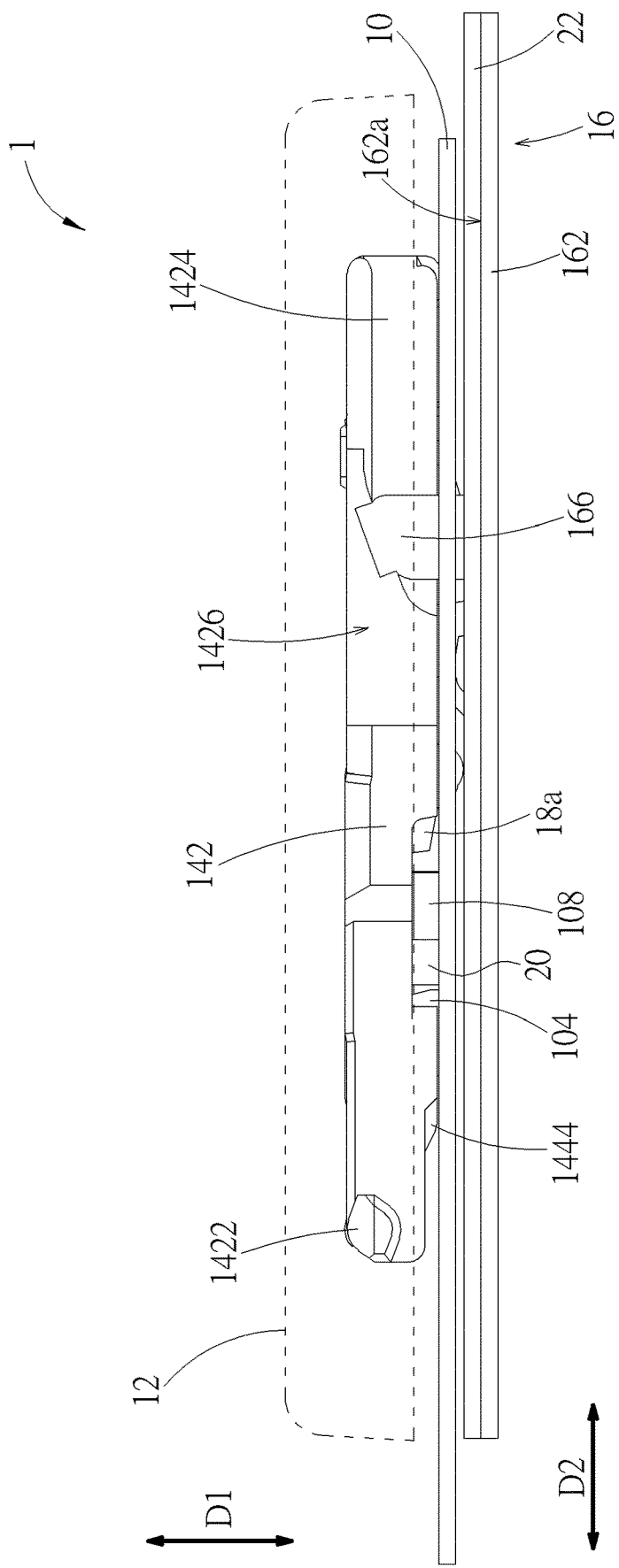
FIG. 13 is a side view of the keyswitch structure in FIG. 1 at the storage status; therein, the profile of the keycap is shown in dashed lines.

Please refer to FIG. 1 to FIG. 5, FIG. 8, and FIG. 13. In the embodiment, the keyswitch structure 1 further includes other interactive structures for facilitating keeping the keyswitch structure 1 at the storage status. Therein, the first support 142 includes two sliding slots 1426 extending along an extension direction 142a (indicated by an arrow in FIG. 2 to FIG. 5). The extension direction 142a points from the first lower end portion 1424 to the first upper end portion 1422. The movable part 18 includes two sliding hooks 166 corresponding to the sliding slots 1426 respectively. During the movement of the movable part 16 from the first position (as shown by FIG. 2 or FIG. 8) to the second position (as shown by FIG. 13), the sliding hook 166 slides in the corresponding sliding slot 1426 and applies a force to the sliding slot 1426 to rotate the first support 142 toward the base plate 10, so as to reduce the height of the first upper end portion 1422. Furthermore, during this movement, the movement of the protruding portion 164 away from the position under the connection portion 182 is conducive to the rotation of the first support 142 toward the base plate 10, so the resistance to the sliding of the sliding hook 166 in the sliding slot 1426 can be reduced. Therefore, the moving away of the protruding portion 164 and the sliding of the sliding hook 166 in the sliding slot 1426 are conducive to keeping the keyswitch structure 1 at the storage status.

Furthermore, in the embodiment, the sliding slot 1426 includes an opening 1426a and a slot way 1426b. During the movement of the movable part 16 from the first position to the second position, the sliding hook 166 enters the slot way 1426b from the opening 1426a. The slot way 1426b has a slot bottom surface 1426c. The slot bottom surface 1426c extends in a direction deviating from the extension direction 142a and toward the base plate 10. During the movement of the movable part 16 from the first position to the second position, the sliding hook 166 slides on the slot bottom surface 1426c toward the first lower end portion 1424. Furthermore, projections in the vertical direction D1 of the sliding slot 1426 and the driving portion 186 are located at the same side of the rotation axis 14a, which can be understood on FIG. 2 and will not be described further.

Furthermore, in the embodiment, there are two of the sliding slot 1426 (and the corresponding sliding hook 166) disposed; however, in practice, it is applicable to dispose one, which still can achieve the function of collapsing the supports as described above and will not be described in addition.

Figure 14:
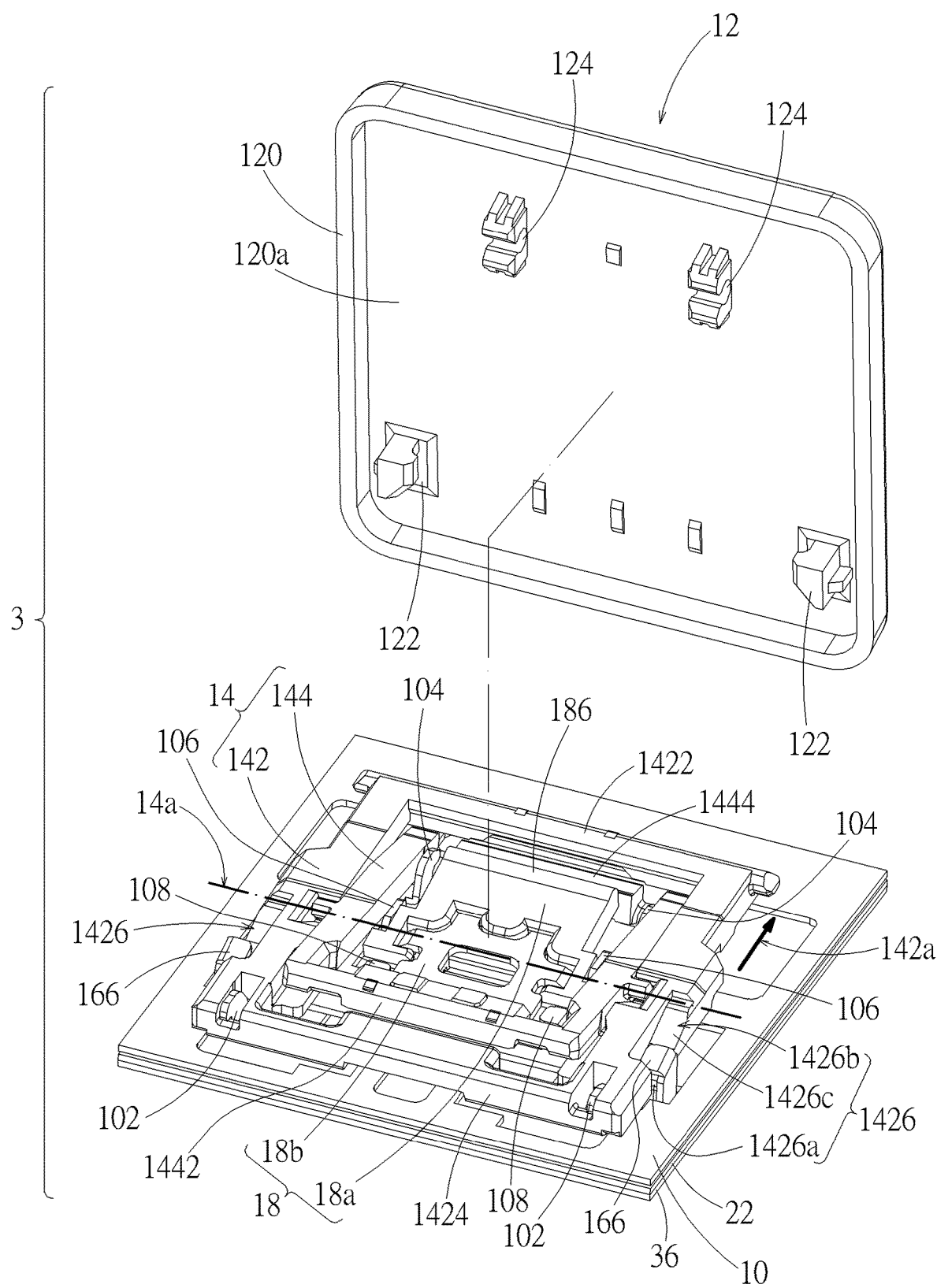
FIG. 14 is a partially-exploded view of a keyswitch structure according to another embodiment.
Figure 15:
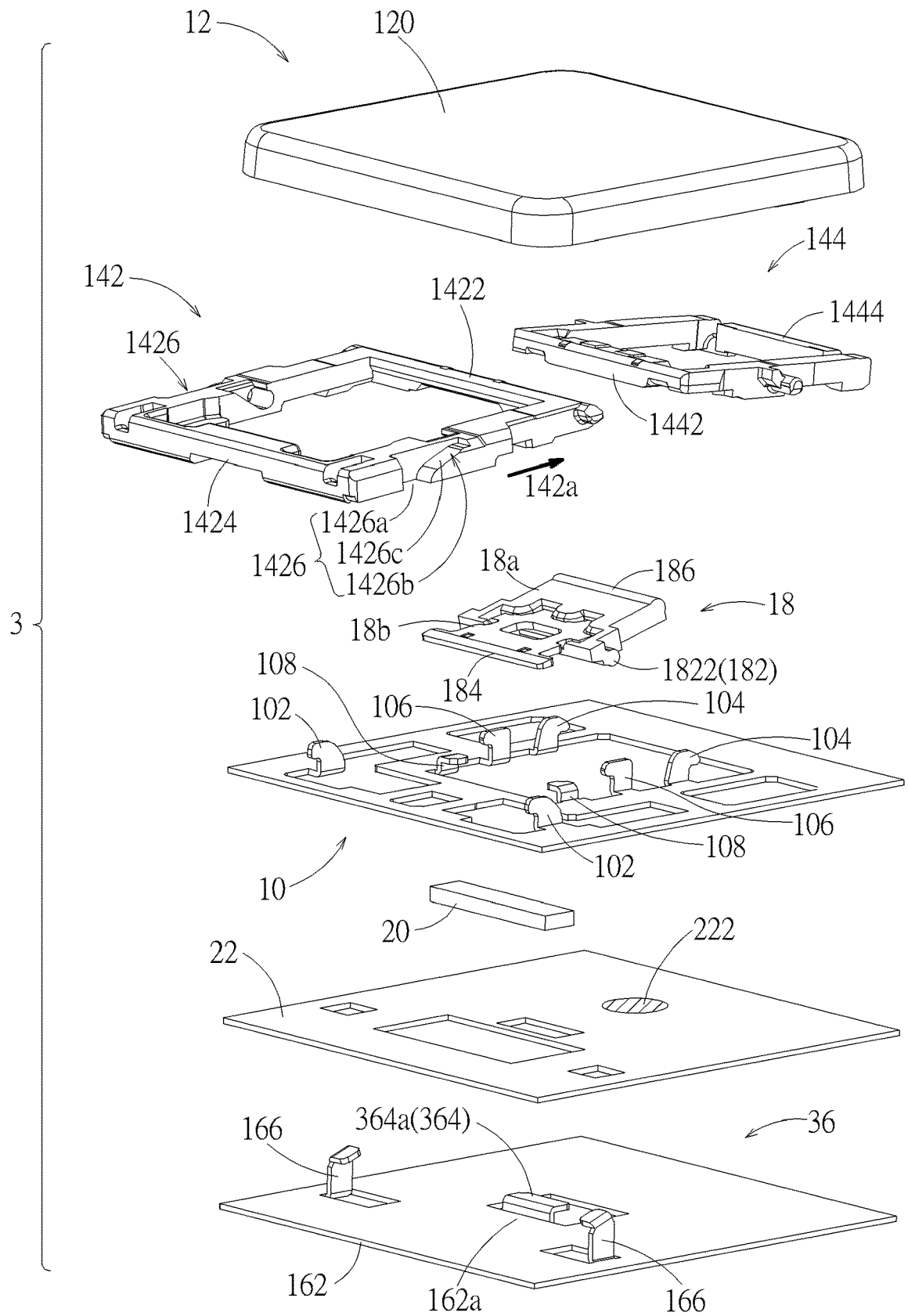
FIG. 15 is an exploded view of the keyswitch structure in FIG. 14.
Figure 16:
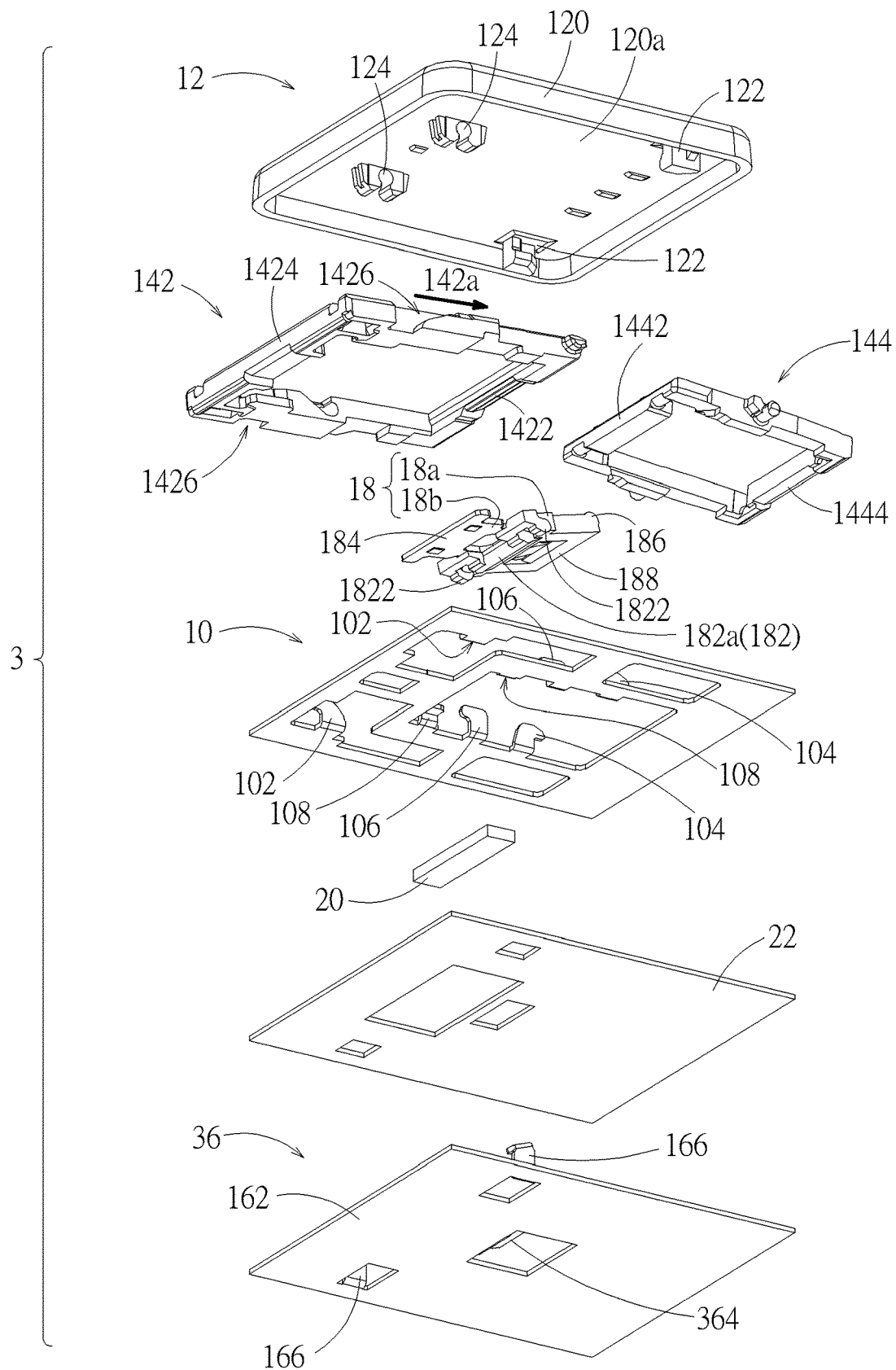
FIG. 16 is a schematic diagram illustrating FIG. 15 in another view.
Figure 17:
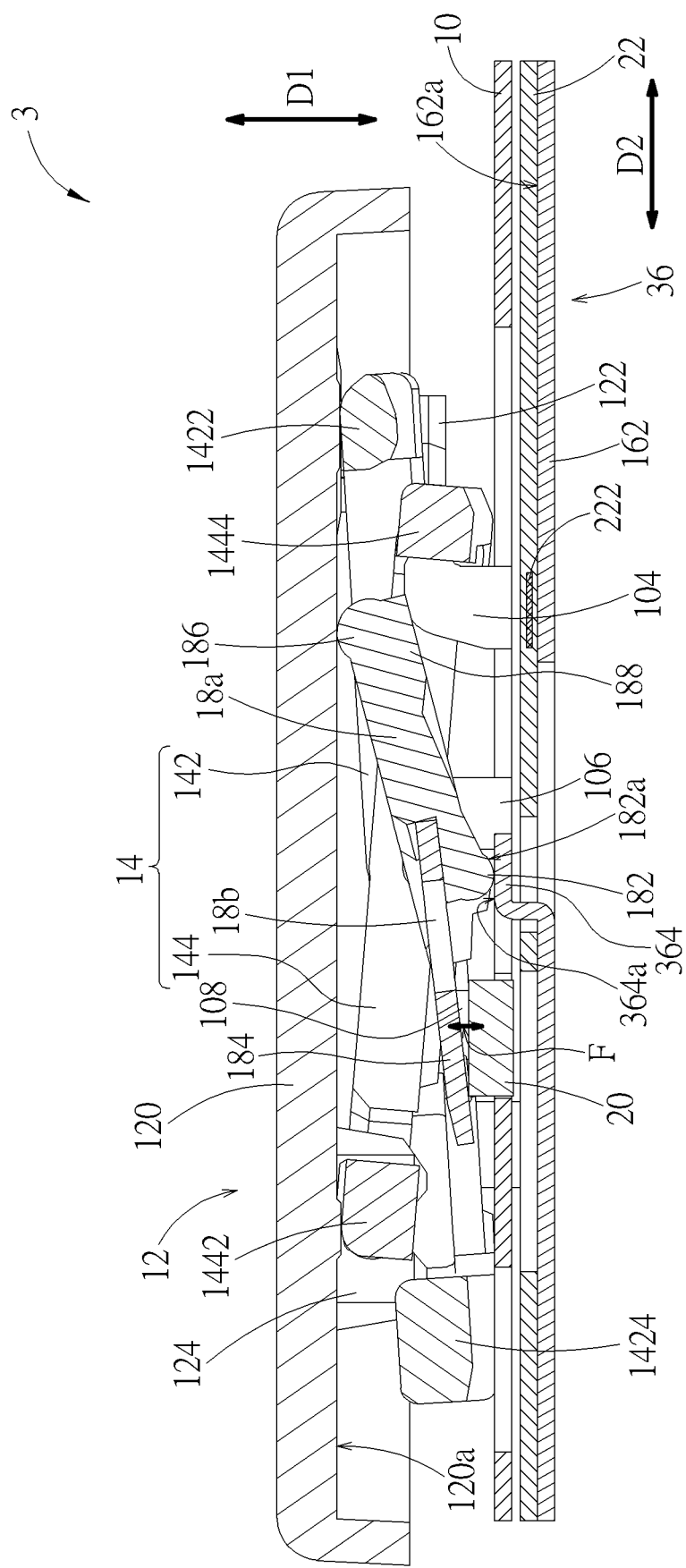
FIG. 17 is a sectional view of the keyswitch structure in FIG. 14.
Figure 18:
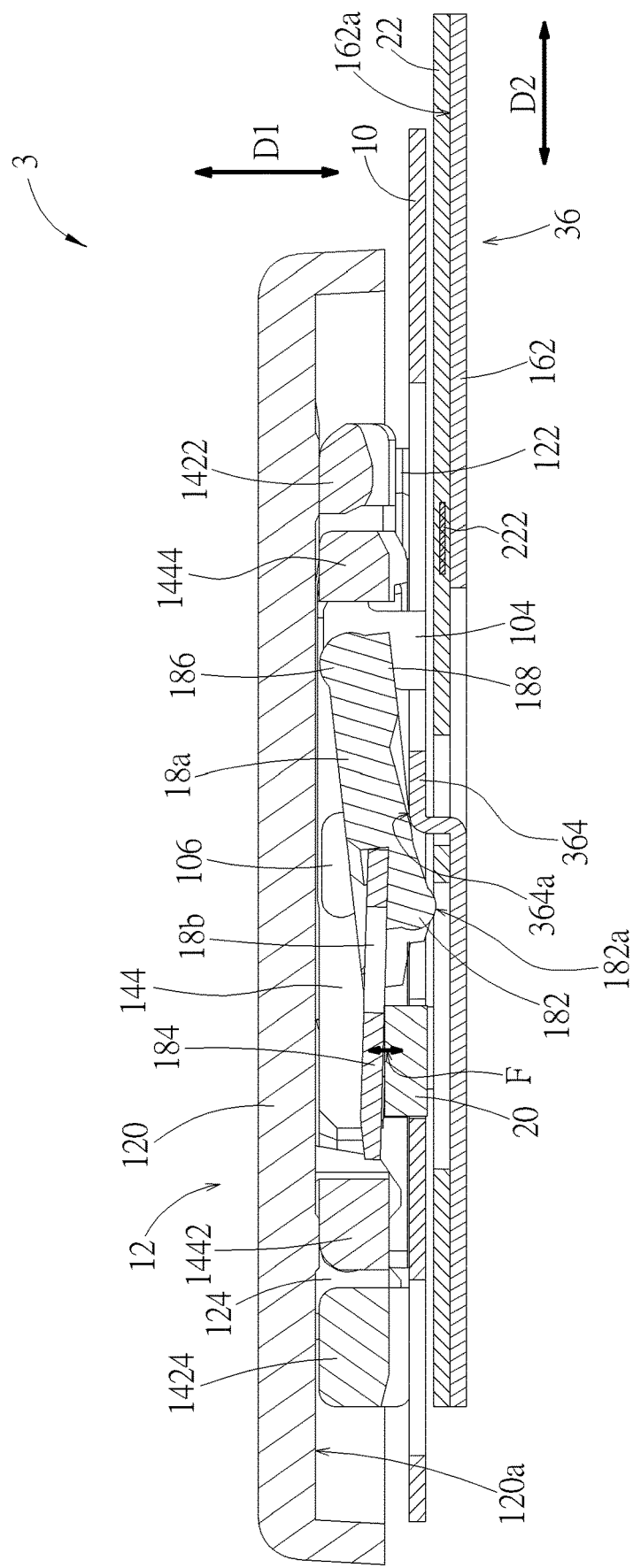
FIG. 18 is a sectional view of the keyswitch structure in FIG. 17 at a storage status.
Figure 19:
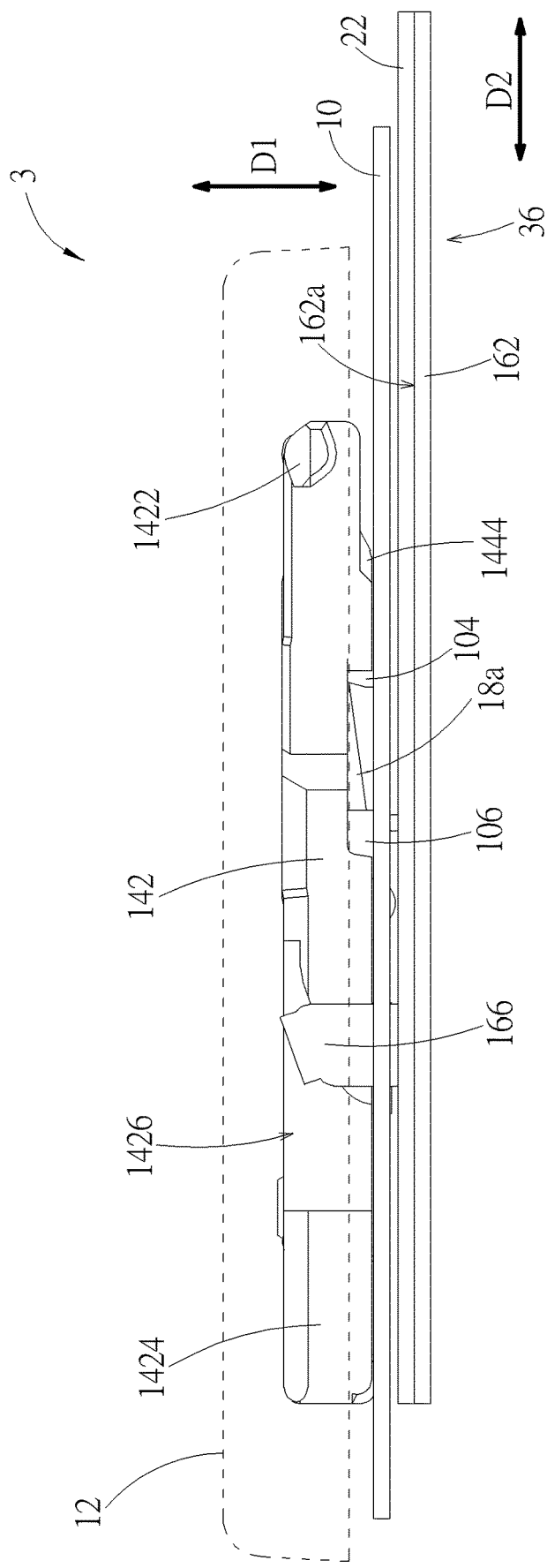
FIG. 19 is a side view of the keyswitch structure in FIG. 14 at a storage status; therein, the profile of the keycap is shown in dashed lines.

Please refer to FIG. 14 to FIG. 19; therein, the position of the cutting planes of FIG. 17 and FIG. 18 are equivalent to the line X-X in FIG. 1. A keyswitch structure 3 according to another embodiment is similar to the keyswitch structure 1 and uses the reference numbers of the keyswitch structure 1. For other descriptions about the keyswitch structure 3, please refer to the relevant descriptions of the keyswitch structure 1 and variants thereof, which will not be described in addition. A difference between the keyswitch structure 1 and the keyswitch structure 3 is that the linking support 18 (or the driving portion 186 thereof) of the keyswitch structure 3 abuts directly against the bottom surface 120a of the cap body 120. Furthermore, in the keyswitch structure 3, the projections in the vertical direction D1 of the sliding slot 1426 and the driving portion 186 are located at opposite sides of the rotation axis 14a respectively. The slot bottom surface 1426c extends in a direction deviating from the extension direction 142a and toward the keycap 12. During the movement of the movable part 16 from the first position (as shown by FIG. 14) to the second position (as shown by FIG. 18), the sliding hook 166 slides on the slot bottom surface 1426c toward the first upper end portion 1422. Furthermore, in the embodiment, the protruding portion 364 of the movable part 36 is a form of L-shaped structure. During the movement of the movable part 16 from the second position (as shown by FIG. 18) to the first position (as shown by FIG. 17), the pivotal connection portion 182 still can be smoothly guided through the curved surface 182a of the pivotal connection portion 182 to slide from the surface 162a of the movable plate 162 back to the top surface 364a so as to make the keyswitch structure 3 be at the status of being capable of being pressed by user (as shown by FIG. 17).

Furthermore, in the keyswitch structures 1 and 3, the first support 142 is an outer ring and the second support 144 is an inner ring. The inner ring is pivotally connected to the inner side of the outer ring. The linking support 18 is located within the inner side of the inner ring. The sliding slot 1426 is disposed on the first support 142. However, it is not limited thereto in practice. For example, in the keyswitch structure 3, the second support 144 can be modified to be an n-shaped structure, such that the linking support 18 can extend outward to abut against the first support 142, and the linking support 18 will not structurally interfere with the second support 144 in a press on the keycap 12. For another example based on the keyswitch structure 1, the sliding slots 1426 of the first support 142 and the corresponding sliding hooks 166 are removed, and instead, the sliding slots 1426 and the corresponding sliding hooks 166 in keyswitch structure 3 are applied to the second support 144 herein. In this example, projections in the vertical direction D1 of the sliding slot 1426 and the driving portion 186 are located at two opposite sides of the rotation axis 14a. The inner side of the first support 142 may need structural amendment for avoiding structural interference, which will not be described in addition. Similarly, in the keyswitch structure 3, the sliding slots 1426 of the first support 142 and the corresponding sliding hooks 166 can be removed, and instead, the sliding slots 1426 and the corresponding sliding hooks 166 in the keyswitch structure 1 are applied to the second support 144 herein. For another example, compared with scissors supports, the lift mechanism 14 can be replaced with a butterfly support (including two supports that are connected with each other in a V-shaped configuration), and the linking support 18 can abut against one of the supports or directly against the keycap 12.

In addition, in the keyswitch structures 1 and 3, the movable parts 16 and 36 are slidably disposed under the base plate 10; however, it is not limited thereto in practice. For example, the movable parts 16 and 36 are changed to be disposed above the base plate 10 and are provided with openings corresponding to the structures of the base plate 10 (e.g. the base plate connection portions 102 and 104, the limitation structures 106, the constraint structures 108, the stop structure 110 and so on) for avoiding structural interference.

In the keyswitch structures 1 and 3, the keycap 12 still can move downward for storage even though the keycap 12 does not receive external pressing force thereon. Furthermore, the restoration force (i.e. the magnetic attraction force) to the keycap 12 is not produced by an elastic structure, so the keyswitch structures 1 and 3 will not have the problem in the prior art that the elastic member may involve a permanent deformation affecting the elasticity of the elastic member.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A keyswitch structure, comprising:
a base plate;
a keycap, disposed above the base plate;
a lift mechanism, connected and between the base plate and the keycap, the keycap being movable relative to the base plate substantially along a vertical direction through the lift mechanism;
a movable part, movably disposed relative to the base plate along a horizontal direction, the movable part comprising a movable plate and a protruding portion, the protruding portion protruding upward from a surface of the movable plate;
a linking support, having a pivotal connection portion, a magnetic portion, and a driving portion, the magnetic portion and the driving portion being located at two sides of the pivotal connection portion, the linking support rotatably disposed on the protruding portion through the pivotal connection portion, the driving portion abutting against one of the lift mechanism and the keycap; and
a magnetic part, disposed on the base plate, the magnetic portion and the magnetic part producing a magnetic attraction force therebetween;
wherein when the movable part is located at a first position, the magnetic part is located under the magnetic portion, and the magnetic attraction force drives the keycap through the linking support to move away relative to the base plate; and when the movable part horizontally moves from the first position to a second position, the magnetic part moves away from a position under the pivotal connection portion, so that the pivotal connection portion departs from the protruding portion and moves downward so as to make the keycap move toward the base plate.

2. The keyswitch structure according to claim 1, wherein the protruding portion has a top surface and a guiding slant surface, the pivotal connection portion has a curved surface, and when the movable part substantially horizontally moves from the second position to the first position, the guiding slant surface guides the curved surface to slide upward from the surface of the movable plate back to the top surface.

3. The keyswitch structure according to claim 1, wherein the base plate comprises a limitation structure, when the movable part is located at the first position, the pivotal connection portion fits in the limitation structure, and when the movable part is located at the second position, the pivotal connection portion departs from the limitation structure.

4. The keyswitch structure according to claim 1, wherein when the movable part is located at the first position and the keycap is not pressed, the magnetic portion line-contacts the magnetic part.

5. The keyswitch structure according to claim 1, wherein when the movable part is located at the first position and the keycap is not pressed, the magnetic portion and the magnetic part separate from each other.

6. The keyswitch structure according to claim 1, wherein the linking support bottom surface has a relief recess, and when the movable part is located at the second position, the protruding portion enters the relief recess so as to reduce a height of the pivotal connection portion and the protruding portion when collapsed.

7. The keyswitch structure according to claim 1, further comprising a switch, disposed on the movable part, wherein when the movable part is located at the first position, the switch is located under the linking support, and when the movable part is located at the second position, the switch is away from a projection area where the linking support is projected downward along the vertical direction.

8. The keyswitch structure according to claim 7, wherein the linking support has a triggering portion, and when the movable part is located at the first position and the keycap is pressed, the triggering portion triggers the switch.

9. The keyswitch structure according to claim 1, wherein the lift mechanism comprises a first support and a second support which are pivotally connected with each other, the keycap is vertically movable relative to the base plate through the first support and the second support, the first support is connected to the keycap through a first upper end portion of the first support and is connected to the base plate through a first lower end portion of the first support, and the second support is connected to the keycap through a second upper end portion of the second support and is connected to the base plate through a second lower end portion of the second support.

10. The keyswitch structure according to claim 9, wherein the first support comprises a sliding slot, extending along an extension direction, the extension direction points from the first lower end portion to the first upper end portion, the movable part comprises a sliding hook, and during a movement of the movable part from the first position to the second position, the sliding hook slides in the sliding slot and applies a force to the sliding slot so that the first support rotates toward the base plate, so as to reduce a height of the first upper end portion.

11. The keyswitch structure according to claim 10, wherein the sliding slot has a slot bottom surface, the slot bottom surface extends in a direction deviating from the extension direction and toward the base plate, and during a movement of the movable part from the first position to the second position, the sliding hook slides on the slot bottom surface toward the first lower end portion.

12. The keyswitch structure according to claim 10, wherein the first support and the second support are pivotally connected relative to a rotation axis, the driving portion abuts against the second upper end portion of the second support, and projections in the vertical direction of the sliding slot and the driving portion are located at the same side of the rotation axis.

13. The keyswitch structure according to claim 10, wherein the first support and the second support are pivotally connected relative to a rotation axis, the driving portion abuts against the keycap, and projections in the vertical direction of the sliding slot and the driving portion are located at two opposite sides of the rotation axis respectively.

14. The keyswitch structure according to claim 13, wherein the sliding slot has a slot bottom surface, the slot bottom surface extends in a direction deviating from the extension direction and toward the keycap, and during a movement of the movable part from the first position to the second position, the sliding hook slides on the slot bottom surface toward the first upper end portion.

15. The keyswitch structure according to claim 9, wherein the first support is an outer ring, the second support is an inner ring, the inner ring is pivotally connected to an inner side of the outer ring, and the linking support is located in an inner side of the inner ring.

16. The keyswitch structure according to claim 1, wherein the linking support comprises a plastic part and a paramagnetic plate joined to the plastic part, the plastic part forms the driving portion and the pivotal connection portion, and the paramagnetic plate forms the magnetic portion.

17. The keyswitch structure according to claim 1, wherein during a movement of the movable part from the first position to the second position, the magnetic attraction force increases so as to rotate the linking support toward the base plate.

18. The keyswitch structure according to claim 1, further comprising a switch, disposed on the movable part, wherein the movable part is disposed under the base plate.

* * * * *